United States Patent
Han et al.

(10) Patent No.: US 7,379,378 B2
(45) Date of Patent: *May 27, 2008

(54) OVER DRIVING CONTROL SIGNAL GENERATOR IN SEMICONDUCTOR MEMORY DEVICE

(75) Inventors: Hi-Hyun Han, Ichon-shi (KR); Sang-Hee Kang, Ichon-shi (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 11/712,466

(22) Filed: Mar. 1, 2007

(65) Prior Publication Data
US 2007/0153592 A1    Jul. 5, 2007

Related U.S. Application Data

(63) Continuation of application No. 11/191,008, filed on Jul. 28, 2005, now Pat. No. 7,196,965.

(30) Foreign Application Priority Data
Mar. 31, 2005    (KR) .......................... 2005-0027403

(51) Int. Cl.
  G11C 7/00      (2006.01)
  G11C 8/00      (2006.01)
(52) U.S. Cl. ........................ 365/230.06; 365/189.08; 365/194
(58) Field of Classification Search ........... 365/189.05, 365/189.08, 194, 230.06, 230.08, 189.09, 365/189.11, 205, 207, 208, 226, 227
See application file for complete search history.

(56) References Cited

U.S. PATENT DOCUMENTS

| | | | | |
|---|---|---|---|---|
| 5,966,337 | A * | 10/1999 | Lee et al. | 365/203 |
| 6,097,653 | A * | 8/2000 | Park | 365/207 |
| 6,128,235 | A * | 10/2000 | Jung | 365/207 |
| 6,542,426 | B2 * | 4/2003 | Jung et al. | 365/194 |
| 6,717,880 | B2 | 4/2004 | Jeong | |
| 6,778,460 | B1 | 8/2004 | Jung | |
| 6,853,593 | B1 | 2/2005 | Bae | |
| 6,925,020 | B2 | 8/2005 | Kwon | |
| 6,928,023 | B2 * | 8/2005 | Lee et al. | 365/230.06 |
| 7,020,043 | B1 * | 3/2006 | Lee | 365/230.06 |
| 7,158,423 | B2 * | 1/2007 | Seo | 365/230.06 |
| 7,158,430 | B2 * | 1/2007 | Byun | 365/207 |

* cited by examiner

*Primary Examiner*—Trong Phan
(74) *Attorney, Agent, or Firm*—McDermott Will & Emery LLP

(57) ABSTRACT

A bit line over driving control signal generator generates an over driving control signal in response to an over driving signal. The over driving signal is generated in response to an active command. The bit line over driving control signal generator for use in a semiconductor memory device includes a delaying unit for delaying an over driving signal generated in response to an active command to thereby output a delayed over driving signal, a controlling unit for determining whether the delayed over driving signal is outputted without any modification or outputted with being disabled in response to the over driving signal, a read command, and a precharge command, and a pulse width adding unit for adding a predetermined pulse width of the delayed over driving signal to the over driving signal to thereby output a bit line over driving control signal.

17 Claims, 6 Drawing Sheets

OVER DRIVING CONTROL SIGNAL GENERATOR IN SEMICONDUCTOR MEMORY DEVICE

RELATED APPLICATIONS

This application is a continuation of application Ser. No. 11/191,008, filed on Jul. 28, 2005, which issued on Mar. 27, 2007 as U.S. Pat. No. 7,196,965, which in turn claims the benefit of Korean Patent Application No. 2005-0027403, filed on Mar. 31, 2005, the disclosures of which Applications are incorporated by reference herein.

FIELD OF INVENTION

The present invention relates to a semiconductor memory device; and, more particularly, to an over driving control signal generator for use in a semiconductor memory device.

DESCRIPTION OF PRIOR ART

As a size of a semiconductor memory is decreased, a level of an internal voltage also becomes lower. Most semiconductor memories include an internal voltage generator for generating various kinds of internal voltages used for internal operations of the semiconductor memories. Among the various kinds of internal voltages, a semiconductor memory device using a bit line sense amplifier (hereinafter, referred as BLSA), such as a DRAM, uses a core voltage for sensing a cell data.

After a word line selected by a row address is activated for a read operation, data stored in a plurality of memory cell connected to the selected word line are transmitted to each bit line, and each BLSA senses and amplifies a voltage difference between each bit line pair. Performing the read operation, because millions of the BLSAs are operated at once, large amount of current is consumed for operating the millions of the BLSAs. Herein, it is hard to operate the large amount of the BLSAs by using the core voltage VCORE of low voltage level in a short time.

To solve the above mentioned problem, a power supply line for enabling the BLSA is driven by using an over driving method which uses a voltage higher than the core voltage VCORE instead of the core voltage VCORE for driving the power supply line at an initial operation of the BLSA, i.e., right after the memory cell and the bit line shares an electric charge. Herein, the voltage used for the over driving method is usually a power supply voltage VDD.

FIG. 1 is a block diagram describing a BLSA array using an over driving method.

As shown, the BLSA array includes a BLSA 30, an upper and an lower bit line separators 10 and 50, a bit line precharger 20, a column selector 40, and a BLSA power supply line driver 60.

Herein, the upper bit line separator 10 separates and connects an upper memory cell array and the BLSA 30 in response to an upper bit line separating signal BISH. The lower bit line separator 50 disconnects and connects a lower memory cell array and the bit line sensor amplifier 30 in response to a lower bit line separating signal BISL.

When a first power supply line SB and a second power supply line RTO are enabled into a predetermined voltage level, the BLSA 30 senses a voltage difference of a bit line pair BL and BLB and amplifies the voltage difference into a level of a ground voltage VSS and a core voltage VCORE. Meanwhile, the bit line pair BL and BLB has a minute voltage difference.

The bit line precharger 20 precharges the bit line pair BL and BLB into a bit line precharge voltage VBLP in response to a bit line equalizing signal BLEQ. Herein, the bit line precharge voltage VBLP has a half level of the core voltage VCORE, i.e., VCORE/2.

The column selector 40 transmits the amplified voltage difference sensed and amplified by the BLSA 30 to a first and second segment data buses SIO and SIOB in response to a column selecting signal YI after a read command is inputted.

The BLSA power supply line driver 60 is provided with a first normal driver transistor M2, a second normal driver transistor M3, an over driver pulse generator 64, an over driver transistor M1, and a BLSA power supply line precharger 62.

The first normal driver transistor M2 drives the second power supply line RTO by using the core voltage VCORE in response to a first power supply line driving signal SAP. The second normal driver transistor M3 is for driving the first power supply line SB by using the ground voltage VSS in response to a second power supply line driving signal SAN. The over driving pulse generator 64 generates an over driving control signal SAOVDP in response to an over driving signal OVD. Herein, the over driving signal OVD is generated in response to an active command. The over driver transistor M1 drives the core voltage VCORE into a power supply voltage VDD in response to the over driving control signal SAOVDP. The BLSA power supply line precharger 62 is for precharging the first and second power supply lines SB and RTO of the BLSA 30 into a level of the bit line precharge voltage VBLP in response to the bit line equalizing signal BLEQ.

In the above example, the over driving control signal SAOVDP is active high pulse; the over driver transistor M1 is implemented with a NMOS transistor. However, a PMOS transistor performing a pull up operation more efficiently can be used instead of the NMOS transistor.

FIG. 2 is a waveform depicting an operation of the bit line sense amplifier shown in FIG. 1.

Referring to FIG. 2, after a data stored in a memory cell is transmitted to the bit line pair BL and BLB in accordance with a charge sharing, the first and second power supply driving signals SAP and SAN are activated to a logic level 'H'. Then, the second power supply line RTO is over driven by the over driving control signal SAOVDP which is activated to a logic level 'H' in advance of the first and second power supply line driving signals SAP and SAN. That is, after the first and second power supply line driving signals SAP and SAN and the over driving control signal SAOVDP are activated to the logic level 'H', the over driver transistor M1 and the first and second normal driver transistors M2 and M3 are all turned on and drive the second power supply line RTO to a level of the power supply voltage VDD and drive the first power supply line to a level of the ground voltage VSS. Further, after a predetermined time passes, the over driving control signal SAOVDP is inactivated into a logic level 'L'. Then, the second power supply line RTO is driven with the core voltage VCORE.

Meanwhile, if a read command is inputted during the over driving is performed, the column selecting signal YI is activated to a logic level 'H' in response to the read command. Then, the bit line pair BL and BLB and the segment data buses SIO and SIOB are connected and shares an electric charge each other. Accordingly, a voltage level of the bit line pair BL and BLB is decreased in a sudden rapid.

Herein, if the over driving control signal SAOVDP is inactivated into a logic level 'L', i.e., the over driving is finished before the column selecting signal YI is inactivated into a logic level 'L', it takes a relatively long time for the level of the bit line BL to recover the core voltage VCORE level. In other word, an efficiency of the over driving is deteriorated; and the timing margin for following operations such as a restoring is reduced. Further, a timing margin for a sensing operation of the BLSA 30 is also reduced because a relatively low voltage level is transmitted to the first and second segment data buses SIO and SIOB.

SUMMARY OF INVENTION

It is, therefore, an object of the present invention to provide a bit line over driving control signal generator preventing an deterioration of an over driving operation, occurring when an read command is activated while the over driving operation is performed, by widening a pulse width of an over driving control signal.

In accordance with an aspect of the present invention, there is provided a bit line over driving control signal generator for use in a semiconductor memory device includes a delaying unit for delaying an over driving signal generated in response to an active command to thereby output a delayed over driving signal, a controlling unit for determining whether the delayed over driving signal is outputted without any modification or outputted with being disabled in response to the over driving signal, a read command, and a precharge command, and a pulse width adding unit for adding a predetermined pulse width of the delayed over driving signal to the over driving signal to thereby output a bit line over driving control signal

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an over driving control signal generator in accordance with the present invention will be described in detail referring to the accompanying drawings.

Figure 3:
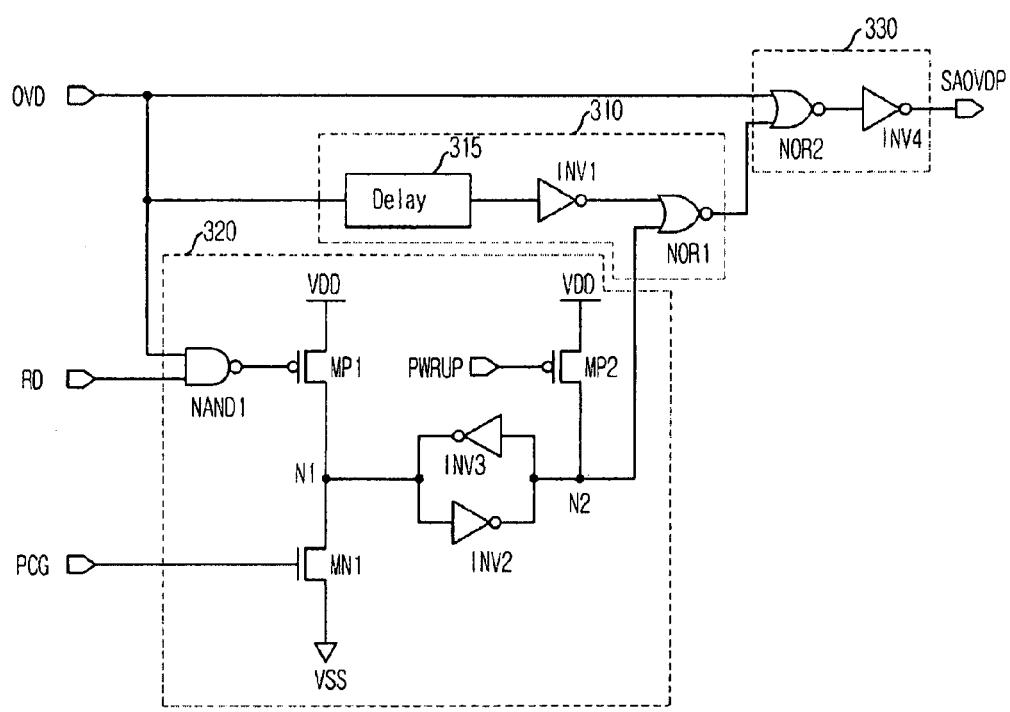
FIG. 3 is a block diagram describing an over driving control signal generator in accordance with a first preferred embodiment of the present invention.

FIG. 3 is a block diagram describing an over driving control signal generator in accordance with a first preferred embodiment of the present invention.

Figure 2:
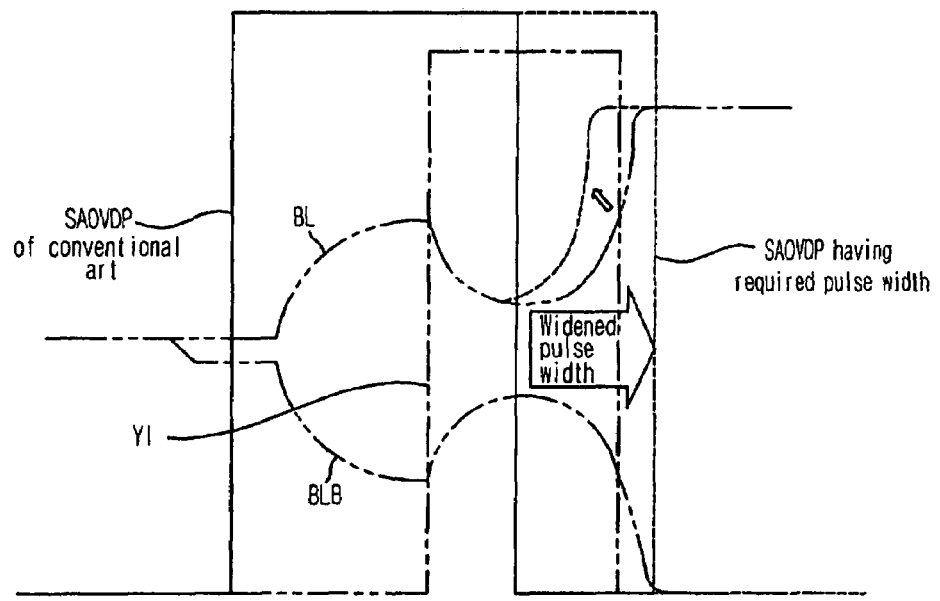
FIG. 2 is a waveform depicting an operation of the bit line sense amplifier shown in FIG. 1.

As shown, the over driving control signal generator includes a delaying unit 310 for delaying an over driving signal OVD to thereby output a delayed over driving signal OVD1, a controlling unit 320, and a pulse width adding block 330. Herein, the controlling unit 320 determines whether the delayed over driving signal OVD1 outputted from the delaying unit 310 is outputted without any modification or is outputted with being disabled in response to the over driving signal OVD, a read command RD, and a precharge command PCG. The pulse width adding unit 330 adds a predetermined pulse width, i.e., a widened pulse width as depicted in FIG. 2, generated by the delaying unit 310 to the over driving signal OVD to thereby output an over driving control signal SAOVDP having a required pulse width.

Meanwhile, the delaying unit 310 is provided with a delay 315 for receiving and delaying the over driving signal OVD for a predetermined time, a first inverter INV1 for inverting an output from the delay 315, and a first NOR gate NOR1 for receiving an output from the first inverter INV1 and an output from the controlling unit 320.

Further, the controlling unit 320 is provided with a first NAND gate NAND1 receiving the read command RD and the over driving signal OVD, a pull up PMOS transistor MP1 receiving an output from the first NAND gate NAND1 through its gate, and a pull down NMOS transistor MN1 receiving the precharge command PCG through its gate. Drains of the pull up PMOS transistor MP1 and the pull down NMOS transistor MN1 are connected to each other at a first node N1. The controlling unit 320 further includes a first latch and an initializing PMOS transistor MP2. The first latch is provided with second and third inverters INV2 and INV3 and connected between the first node N1 and a second node N2. The initializing PMOS transistor MP2 is connected between the first latch and a power supply voltage VDD and receives a power up signal PWRUP through its gate.

The pulse width adding unit 330 is provided with a second NOR gate NOR2 receiving the over driving signal OVD and the delayed over driving signal OVD1 and a fourth inverter INV4 for inverting an output from the second NOR gate NOR2 to thereby output an over driving control signal SAOVDP.

Figure 4:
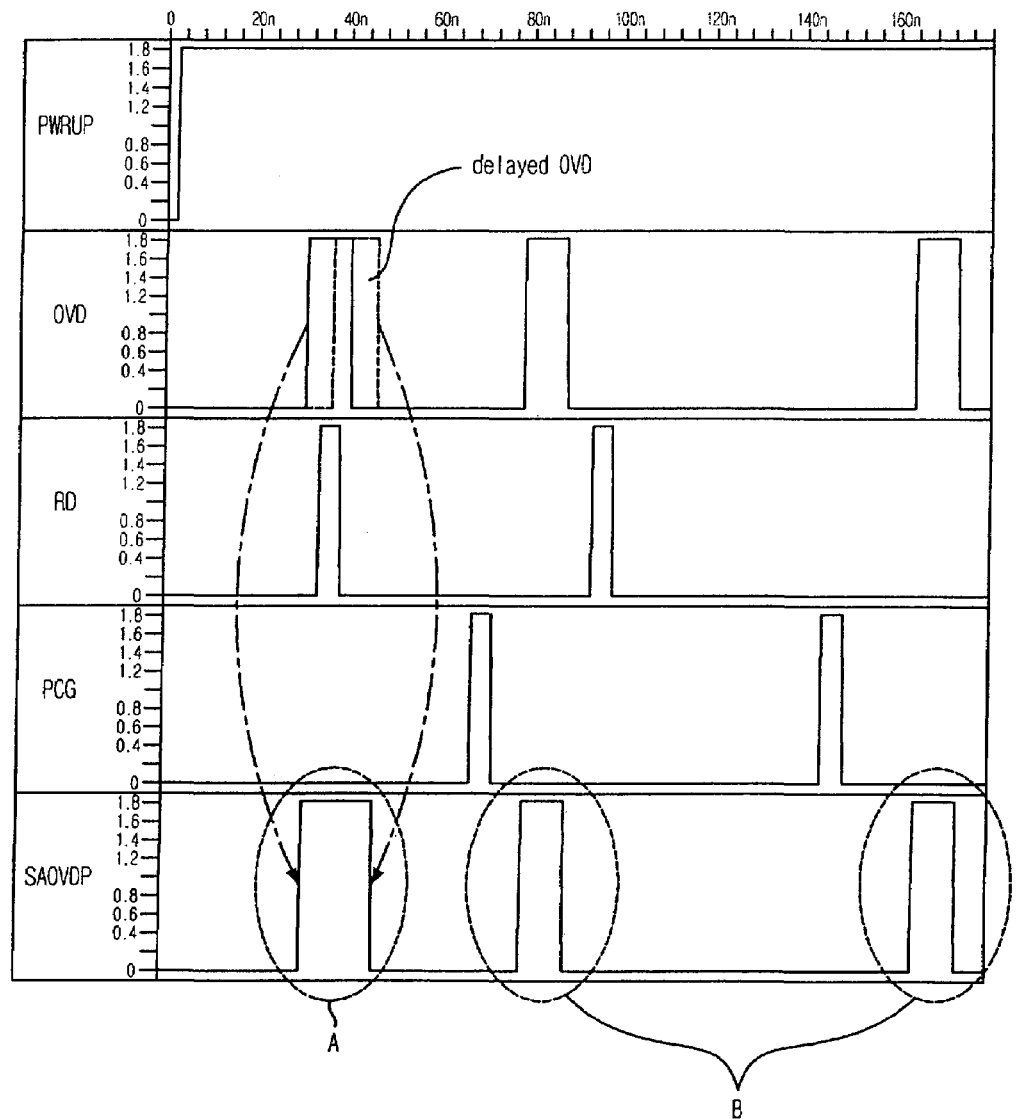
FIG. 4 is a timing diagram of the over driving control signal shown in FIG. 3.

FIG. 4 is a timing diagram of the over driving control signal shown in FIG. 3.

As shown, at an initial stage, i.e., when the power voltage is supplied to a chip, the power up signal PWRUP has a logic level 'L'. The initializing PMOS transistor MP2, receiving the power up signal PWRUP through its gate, is turned on in response to the power up signal PWRUP. The second node N2 connected to a drain of the initializing PMOS transistor MP2 is initialized into a logic level 'H'. Then, the first NOR gate NOR1 of the delaying unit 310 is disabled and the delayed over driving signal OVD1 has a logic level 'L'. Accordingly, the pulse width adding unit 330 outputs the over driving signal OVD as the over driving control signal SAOVDP.

Figure 1:
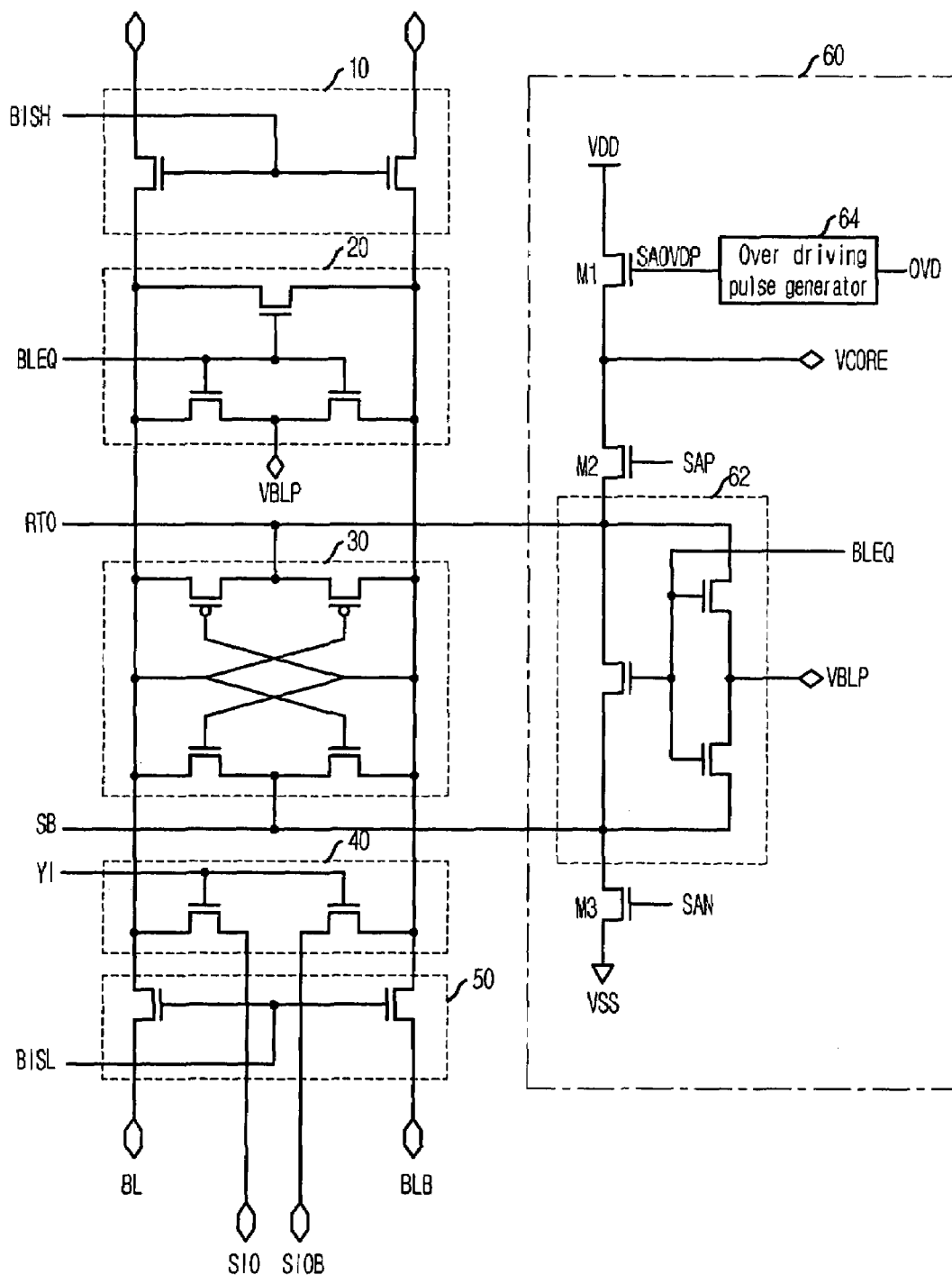
FIG. 1 is a block diagram describing a bit line sense amplifier array using an over driving method.

Meanwhile, after an active command is inputted, the over driving signal OVD is activated into a logic level 'H'. Consequently, first and second power supply line driving signals SAP and SAN shown in FIG. 1 are activated; thus, an over driving is started.

When the read command RD is activated into a logic level 'H' while the over driving is performed, an output of the first NAND gate NAND1 in the controlling unit 320 becomes a logic level 'L'. The pull up PMOS transistor MP1, receiving the output of the first NAND gate NAND1 through its gate, is turned on. Thus, the output from the controlling unit 310 is a logic level 'L'. Herein, the over driving signal OVD with logic level 'H' is inverted by the first inverter INV1 and then inverted once again by the first NOR gate NOR1. That is, the delayed over driving signal OVD1 outputted from the delaying unit 310 has a logic level 'H'.

The pulse width adding unit 330 logically adds a pulse width of the delayed over driving signal OVD1 to a pulse width of the over driving signal OVD to thereby output the over driving control signal SAOVDP which has a wider pulse width compared with the original over driving signal OVD. A pulse denoted to A in FIG. 4 shows the widened pulse of the over driving control signal SAOVD.

After the precharge command PCG is activated into a logic level 'H', the pull down NMOS transistor NM1 of the controlling unit 320 is turned on. Thus, the output from the controlling unit has the initial logic level 'L'.

Meanwhile, when the read command RD and the over driving command OVD are not overlapped each other, the pulse width of the over driving control signal SAOVDP is same with that of the over driving signal OVD. Pulses denoted as B in FIG. 4 show the pulse width of the over driving control signal SAOVDP of this case. This is possible because the level of the second node N2 is not changed in response to the read command RD.

In accordance with the abovementioned first embodiment, the deterioration of the over driving operation occurred when the read command RD is inputted while the over driving operation is performed is prevented by widening the pulse width of the over driving control signal SAOVDP.

Figure 5:
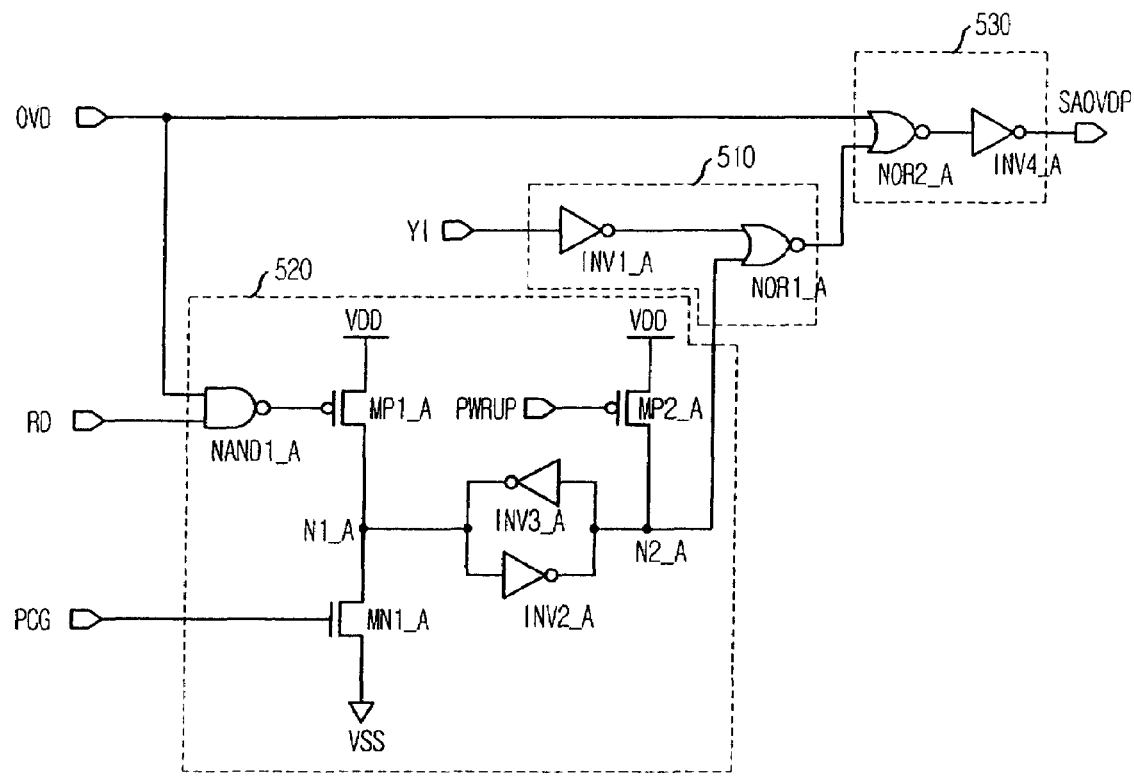
FIG. 5 is a schematic circuit diagram depicting an over driving control signal generator in accordance with a second preferred embodiment of the present invention.

FIG. 5 is a schematic circuit diagram depicting an over driving control signal generator in accordance with a second embodiment of the present invention.

As shown, the over driving control signal generator includes a pulse information provider 510 for providing an pulse information of a column selecting signal YI, a controlling unit 520 for outputting the column selecting signal YI in response to the over driving signal OVD, the read command RD, and the precharge command PCG, and a pulse width adding unit 530 for adding a predetermined pulse width generated by the pulse information provider 510 to the over driving signal OVD to thereby output the over driving control signal SAOVDP.

The pulse information provider 510 is provided with a first inverter INV1_A receiving the column selecting signal YI and a first NOR gate NOR1_A receiving an output from the first inverter INV1_A and an output from the controlling unit 520.

The controlling unit 520 includes a first NAND gate NAND1_A receiving the read command RD and the over driving signal OVD, a pull up PMOS transistor MP1_A receiving an output from the first NAND gate NAND1_A through its gate, and a pull down NMOS transistor MN1_A receiving the precharge command PCG through its gate. Drains of the pull up PMOS transistor MP1_A and the pull down NMOS transistor MN1_A are connected to a first node N1_A.

The controlling unit 520 further includes a latch and an initializing PMOS transistor MP2_A. The latch is provided with second and third inverters INV2_A and INV3_A and is connected between the first node N1_A and a second node N2_A. The initializing PMOS transistor MP2 is connected between the second node N2_A and the power supply voltage VDD and receives the power up signal PWRUP through its gate.

The pulse width adding unit 530 is provided with a second NOR gate NOR2_A receiving the over driving signal OVD and an output from the pulse information provider 510 and a fourth inverter INV4_A for inverting an output from the second NOR gate NOR2_A to thereby output the over driving control signal SAOVDP.

That is, while the first embodiment of the present invention uses the delayed over driving signal OVD1 for generating the over driving control signal SAOVDP, the second embodiment uses the column selecting signal YI which is activated by the read command.

Figure 6:
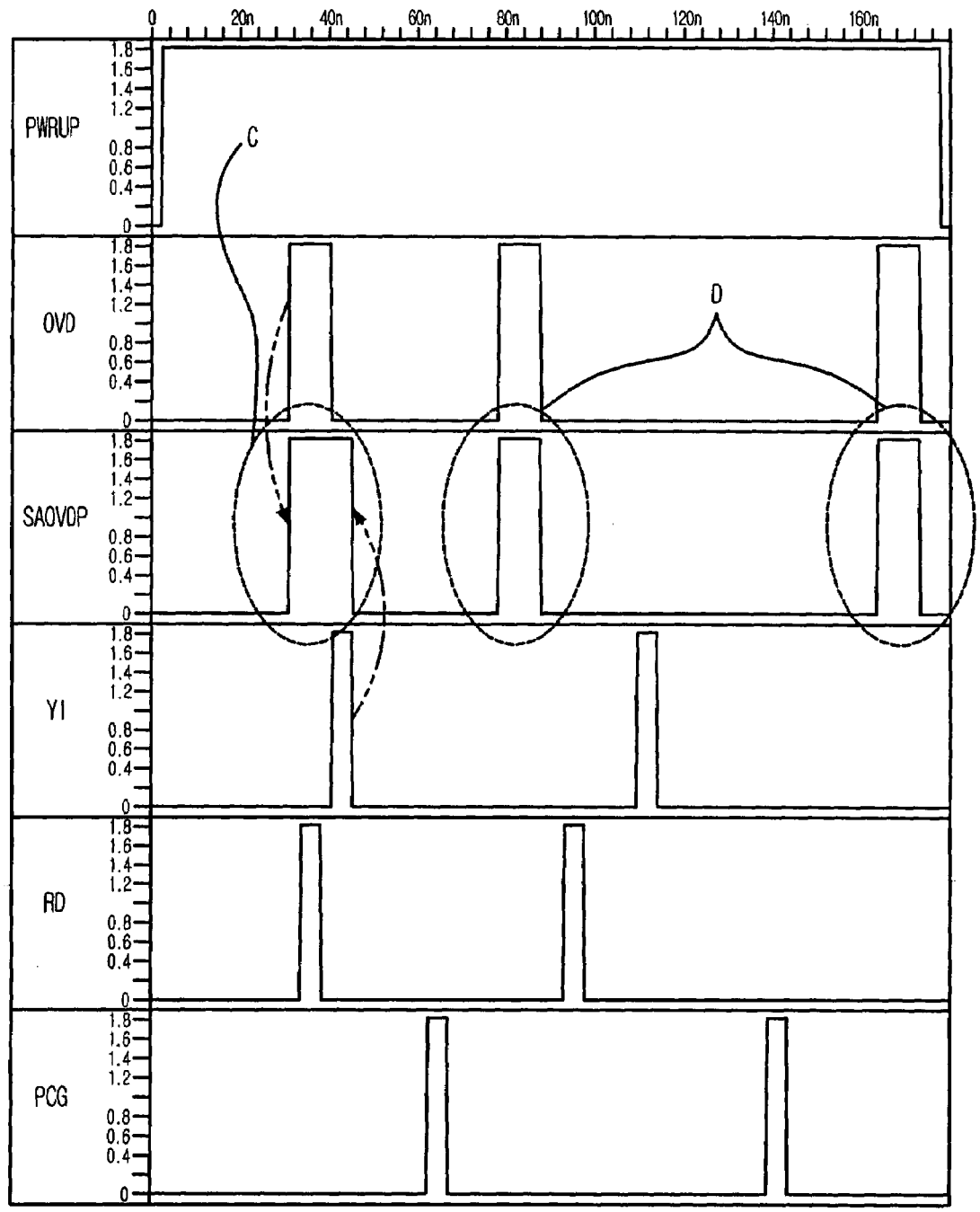
FIG. 6 is a timing diagram of the over driving control generator shown in FIG. 5.

FIG. 6 is a timing diagram of the over driving control signal generator shown in FIG. 5.

As shown, at first, the power up signal PWRUP has a logic level 'L' in an initial state. The initializing PMOS transistor MP2_A of the controlling unit 520 is turned on in response to the power up signal PWRUP. The second node N2_A connected to the initializing PMOS transistor MP2_A is initialized into a logic level 'H'. The first NOR gate NOR1_A of the pulse information provider 510 receiving the output from the controlling unit 520 is disabled and outputs a logic level 'L' regardless of a level of the column selecting signal YI. Accordingly, the pulse width adding unit 530 outputs the over driving signal OVD as the over driving control signal SAOVDP without any modification.

Meanwhile, after the over driving signal OVD is activated into a logic level 'H' in response to the active command, the first and second power supply line driving signals SAP and SAN are activated; then, the over driving operation is started.

When the read command is activated to a logic level 'H' while the over driving operation is performed, the first NAND gate NAND1_A outputs a logic level 'H'. The pull up PMOS transistor MP1_A is turned on in response to the output from the first NAND gate NAND1_A. Therefore, the first node N1_A connected to the drain of the pull up PMOS transistor MP1_A has a logic level 'H'. The latch provided with the second and third inverters INV2_A and INV3_A inverts the level of the first node N1_A. In other words, the output from the controlling unit 520 becomes a logic level 'L'.

Because of the output from the controlling unit 520 with the logic level 'L', the first NOR gate NOR1_A in the pulse information provider 510 performs an inverting operation. Accordingly, the column selecting signal YI is delayed and outputted from the pulse information provider 510 without any modification.

The pulse width adding unit logically adds a pulse width of the column selecting signal YI delayed by the pulse information provider 510 to a pulse width of the over driving signal OVD to thereby output the over driving control signal SAOVDP which has a wider pulse width than the original over driving signal OVD. The pulse with a logic level 'H' denoted to C in FIG. 6 represents the widened over driving control signal SAOVDP.

After the precharge command PCG is activated into a logic level 'H', the pull down NMOS transistor MN1_A is turned on in response to the precharge command PCG. Therefore, the controlling unit 520 outputs the logic level 'H'.

Further, the pulses denoted to 'D' shown in FIG. 6 have the same pulse width with the over driving signal OVD because the read command RD and the over driving signal OVD is not overlapped.

The over driving control signal generator in accordance with the second embodiment prevents the over driving control signal SAOVDP from being inactivated into the logic level 'L' while the column selecting signal YI is activated into the logic level 'H', by widening the pulse width of the over driving control signal SAOVDP.

In another embodiment of the present invention, the types and locations of the transistors and logic gates can be varied depending on input signals.

The present invention prevents the deterioration of the over driving operation by widening the pulse width of the over driving control signal. Herein, the deterioration is caused when the read command is activated while the over driving operation is performed. Further, the present invention obtains a timing margin for a following operation coming after the over driving operation.

The present application contains subject matter related to Korean patent application No. 2005-27403, filed in the Korean Patent Office on Mar. 31, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory apparatus, comprising:
a controlling means configured to control an over driving operation in response to an over driving signal and a read command; and
a pulse width adding means configured to add a predetermined pulse width to the over driving signal in response to an output of the controlling means to thereby output a bit line over driving control signal,
wherein a pulse width of the bit line over driving control signal is increased when both of the read command and the over driving signal are activated.

2. The semiconductor memory apparatus of claim 1, wherein the controlling means includes:
an over drive time control signal generator for generating an over drive time control signal in response to the over driving signal, a read command, and a precharge command; and a delay means for delaying the over driving signal and outputting a delayed over driving signal in response to the over drive time control signal.

3. The semiconductor memory apparatus of claim 1, wherein the controlling means includes:
an over drive time control signal generator for generating an over drive time control signal in response to the over driving signal, a read command, and a precharge command; and
a pulse information providing means for providing a pulse information of a column selecting signal.

4. The semiconductor memory apparatus of claim 3, wherein the pulse information providing means includes:
a first inverter for receiving the column selecting signal; and
a first NOR gate for logically combining an output of the first inverter and the over drive time control signal.

5. The semiconductor memory apparatus of claim 2, wherein the delaying means includes:
a delay configured to delay the over driving signal for a predetermined time;
a first inverter configured to invert an output from the delay; and
a first NOR gate configured to logically combining an output from the first inverter and the over drive time control signal.

6. The semiconductor memory apparatus of claim 5, wherein the over drive time control signal generator includes:
a first NAND gate receiving the read command and the over driving signal;
a pull up PMOS transistor receiving an output from the first NAND gate through its gate;
a pull down NMOS transistor receiving the precharge command through its gate;
an inverting latch connected to a common node formed with drains of the pull up PMOS transistor and the pull down NMOS transistor; and
an initializing PMOS transistor receiving a power up signal through its gate and being connected between the inverting latch and a power supply voltage.

7. The semiconductor memory apparatus of claim 5, wherein the pulse width adding means includes:
a second NOR gate receiving the over driving signal and the delayed over driving signal; and
a second inverter configured for inverting an output from the second NOR gate to thereby output the bit line over driving control signal.

8. A semiconductor memory apparatus, comprising:
a pulse information providing means configured for providing a pulse information of an column selecting signal;
a controlling means configured to determine whether the pulse information outputted from the pulse information providing means is outputted without any modification or outputted being disabled in response to an over driving signal, a read command, and a precharge command; and
a pulse width adding means configured to add a predetermined pulse width to the over driving signal to thereby output a bit line over driving control signal.

9. The semiconductor memory apparatus of claim 8, wherein the pulse information providing means includes:
a first inverter receiving the column selecting signal; and
a first NOR gate receiving an output from the first inverter and an output from the controlling unit.

10. The semiconductor memory apparatus of claim 9, wherein the controlling means includes:
a first NAND gate receiving the read command and the over driving signal;
a pull up PMOS transistor receiving an output from the first NAND gate through its gate;
a pull down NMOS transistor receiving the precharge command through its gate;
an inverting latch connected to a common node formed with drains of the pull up PMOS transistor and the pull down NMOS transistor; and
an initializing PMOS transistor receiving an power up signal through its gate and being connected between the inverting latch and a power supply voltage.

11. The semiconductor memory apparatus of claim 8, wherein the pulse width adding means includes:
a second NOR gate receiving the over driving signal and the delayed column selecting signal; and
a second inverter configured to invert an output from the second NOR gate to thereby output the bit line over driving control signal.

12. The semiconductor memory apparatus of claim 8, wherein the pulse information is disabled in response to an output of the controlling means when the precharge command is activated.

13. A semiconductor memory apparatus, comprising:
a delay block configured to delay an over driving signal by a predetermined time to thereby generate a delayed over driving signal;
a controller configured to determine whether a delayed over driving signal is outputted without any modification or is outputted being disabled in response to a read command; and a pulse controller configured to add a predetermined pulse width of the delayed over driving signal to an over driving signal to thereby generate a bit line driving signal.

14. The semiconductor memory apparatus of claim 13, wherein the delay block includes:
a delay configured to delay the over driving signal for the predetermined time;
a first inverter configured to invert an output from the delay; and
a first NOR gate configured to invert an output from the first inverter and an output from the controller.

15. The semiconductor memory apparatus of claim 13, wherein a precharge command and the over driving signal is activated in response to the read command is inputted.

16. The semiconductor memory apparatus of claim 15, wherein the controller includes:
a first NAND gate receiving the read command and the over driving signal;
a pull up PMOS transistor receiving an output from the first NAND gate through its gate;
a pull down NMOS transistor receiving the precharge command through its gate;
an inverting latch connected to a common node formed with drains of the pull up PMOS transistor and the pull down NMOS transistor; and
an initializing PMOS transistor receiving a power up signal through its gate and being connected between the inverting latch and a power supply voltage.

17. The semiconductor memory apparatus of claim 13, wherein the pulse controller includes:
a second NOR gate receiving an over driving signal and the delayed over driving signal; and
a second inverter configured to invert an output from the second NOR gate to thereby output the bit line driving signal.

* * * * *